United States Patent [19]

de Lozanne

[11] 4,454,522
[45] Jun. 12, 1984

[54] MICROBRIDGE SUPERCONDUCTING DEVICE HAVING SUPPORT WITH STEPPED PARALLEL SURFACES

[75] Inventor: Alejandro L. de Lozanne, Stanford, Calif.

[73] Assignee: The Board of Trustees of the Leland Stanford Junior University, Palo Alto, Calif.

[21] Appl. No.: 318,451

[22] Filed: Nov. 5, 1981

[51] Int. Cl.³ .................... H01L 27/12; H01L 39/22; H01L 29/06
[52] U.S. Cl. .......................................... 357/5; 357/4; 357/55
[58] Field of Search ...................... 357/5, 55, 4, 80, 6; 307/306; 331/107 S

[56] References Cited

U.S. PATENT DOCUMENTS 4,264,916  4/1981  Tsang ....................................... 357/5
4,414,738 11/1983  Jelks et al. ............................. 357/5

FOREIGN PATENT DOCUMENTS 56-114388  9/1981  Japan ..................................... 357/5

OTHER PUBLICATIONS

R. F. Broom, "Making Josephson Tunnel Junctions" IBM Technical Disclosure Bulletin, vol. 17 (1975) p. 2446.

Primary Examiner—Andrew J. James
Assistant Examiner—J. Carroll
Attorney, Agent, or Firm—Flehr, Hohbach, Test, Albritton & Herbert

[57] ABSTRACT

An SNS microbridge superconductive device includes a substrate having first and second generally parallel surfaces which are separated by a generally perpendicular step. A first layer of superconductive material is formed on the first surface, and a second layer of superconductive material is formed on the second surface. A normal or non-superconductive material is formed over the two layers of superconductive material and the step. In fabricating the device, the step functions as a shadow mask during deposition of the superconductive material. The dimensions of the step can be accurately controlled, and the process utilizes conventional technology which is readily and uniformly reproducible.

8 Claims, 6 Drawing Figures

MICROBRIDGE SUPERCONDUCTING DEVICE HAVING SUPPORT WITH STEPPED PARALLEL SURFACES

The United States Government has rights in this invention pursuant to Navy Contract No. (2-WMN-602) N00014-75-C-0632.

This invention relates generally to superconductive device technology, more particularly the invention relates to devices having Josephson junctions and a method of making same.

The Josephson effect in superconducting devices was discovered in the early 1960's and is the basis of superconductive electronic IC circuits. The effect is realized in a tunnel junction device and in a microbridge or weak-link device. In the microbridge device two superconductive layers are interconnected or bridged by a short, narrow constriction formed in the material (designated an SSS device), or by a non-superconducting material such as a superconductive material S' having a superconducting critical temperature, $T_c$, below that of the two superconductive layers (designated SS'S devices), or by a normal or non-superconducting material which is designated an SNS device.

The SNS device has a number of advantages over other types of weak-link superconductive devices, mainly their wide temperature range of ideal behavior and the fact that the properties of the weak-link (i.e. the N material) can be optimized separately from those in the superconducting layers. Further, the SNS device allows the use of high critical temperature superconducting materials.

While the theory of superconducting microbridge devices is presently incomplete, rigid boundary conditions and short bridges are known requisites. The interface of the superconductor layer and the normal material must be very clean and the dimensions of the bridge of normal material, particularly the length, must be accurately maintained in a range below 1000 angstroms. Heretofore, SNS devices have been difficult to fabricate and such devices employing superconductors having high superconducting temperatures have been unknown.

Accordingly, an object of the present invention is an improved method of fabricating a microbridge superconductive device.

Another object of the invention is an improved microbridge superconductive device.

Still another object of the invention is a microbridge superconductive device which is readily manufactured.

Yet another object of the invention is a process for manufacturing microbridge superconductive devices which employs conventional technology and which is readily controlled.

Another object of the invention is a generic process for fabricating SNS microbridges incorporating high $T_c$ superconductors.

A feature of the invention is a substrate having two surfaces separated by a step edge with a superconductive material on the two surfaces and a normal material overlying the superconductive material.

Briefly, in fabricating a superconductive device in accordance with the invention a support is provided having first and second generally parallel surfaces which are separated by generally perpendicular step. A first layer of superconductive material is formed on the first surface and a second layer of superconductive material is formed on the second surface. Then a layer of non-superconductive material is formed over the first and second layers of superconductive material and which provides the microbridge therebetween. Portions of the layer of non-superconductive material are then removed along with the unnecessary underlying superconductive material thereby defining the width of the microbridge.

In providing the support having first and second generally parallel surfaces, a layer of material can be formed on a generally planar surface of a substrate. The layer of material is then selectively etched to define the generally perpendicular step. A surface of the layer of material functions as one of the parallel surfaces, and the surface of the substrate functions as the second generally parallel surface. Importantly, the thickness of the layer of material can be accurately controlled using known techniques.

In forming the first and second layers of superconductive material on the first and second surfaces of the support, the first and second surfaces are oriented with respect to a source of superconductive material and then the superconductive material is evaporated and deposited simultaneously on the first and second surfaces with the step providing a shadow mask whereby no superconductive material deposits on the step.

Importantly, following the formation of the first and second layers of superconductive material the support is rapidly cooled by conductive cooling, and the layer of normal material is then formed over the cooled superconductive layer.

The invention and objects and features thereof will be more readily apparent from the following detailed description and appended claims when taken with the drawing, in which:

Figure 1A:
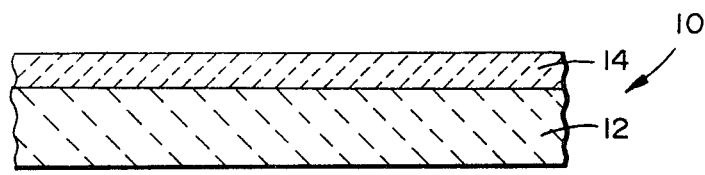
FIGS. 1A–1E are section views illustrating the fabrication of a microbridge superconductive device in accordance with the invention.

Referring now to the drawings, FIGS. 1A–1E are cross section views illustrating the fabrication of a microbridge superconducting SNS device in accordance with the invention. In FIG. 1A a support shown generally at 10 is provided and includes an electrically insulating substrate 12 having a planar surface and an electrically insulating layer 14 formed on the planar surface. In a preferred embodiment the substrate 12 comprises sapphire ($Al_2O_3$) and the layer 14 comprises silicon which may be formed on the surface of the sapphire 12 by conventional vapor deposition techniques. Alternatively, the layer 14 may comprise vapor deposited silicon oxide, silicon nitride, or aluminum oxide. Advantageously, the thickness of layer 14, in the range of 500–2000 angstroms, can be accurately controlled by the vapor deposition.

Figure 1B:
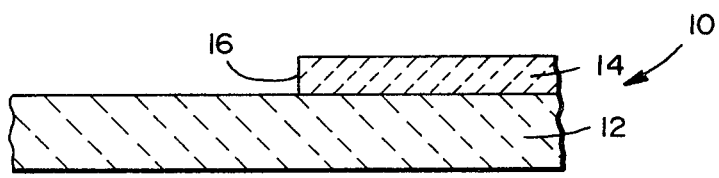

Thereafter, as illustrated in FIG. 1B a portion of the layer 14 is removed by etching using conventional photoresist masking techniques. Preferably, a plasma etching or reactive ion etching is employed whereby the resulting step 16 is generally perpendicular to the planar surface of substrate 12. The etching is carried out in a conventional barrel type plasma etcher using $CF_4$ etching gas. Alternatively, the step 16 could be etched directly in the substrate 12 without the use of a separate layer.

Figure 1C:
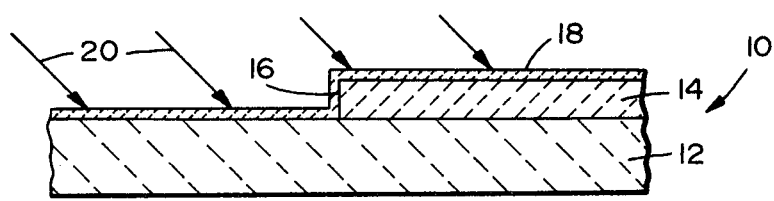

Because of the diffusion of silicon atoms at the elevated temperatures employed later in the process, a barrier layer 18 is formed over the surface of the silicon layer 14 as shown in FIG. 1C. The barrier layer may comprise vapor deposited aluminum oxide with the support 10 oriented with respect to the source of aluminum oxide as indicated by the arrows 20 whereby the step 16 is covered by the layer. Alternatively, the silicon 14 can be thermally oxidized to provide a suitable barrier layer of silicon oxide. The barrier layer has a thickness on the order of 50 angstroms.

Figure 1D:
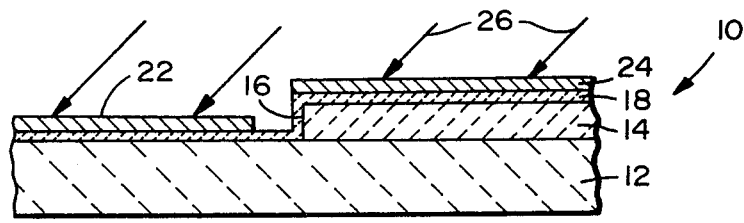
Figure 1E:
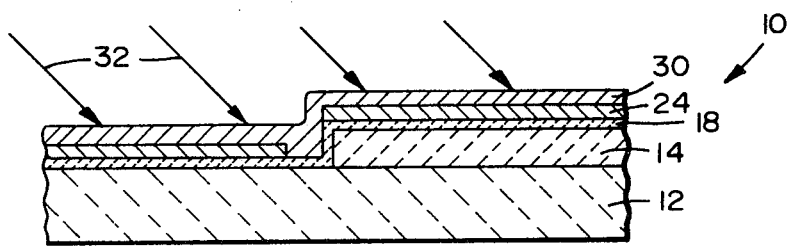

Thereafter, the support 10 is placed in an evaporation chamber for the evaporation of a first layer of superconductive material 22 and a second layer of superconductive material 24 are simultaneously deposited as shown in FIG. 1D. The support 10 is oriented with respect to the source of the superconductive material as indicated by the arrows 26 whereby the step 16 provides a shadow mask and is not covered by the superconductive material. Accordingly, the layers 22 and 24 are discontinuous. Advantageously, the materials for layers 22 and 24 can be selected from high temperature superconductor material such as niobium (Nb), niobium tin ($Nb_3Sn$), and niobium germanium ($Nb_3Ge$), which is applied by E beam co-deposition or other suitable vapor deposition process. Prior to depositing the superconducting material the support 10 is raised to an elevated temperature (850°–900° C. for $Nb_3Ge$ and 750° for $Nb_3Sn$) by means of thermal conduction from an electrically heated plate on which the support 10 is placed. The thickness of the deposited superconducting layers 22, 24 is preferably at least 300 angstroms but less than the height of the step 16.

Thereafter, the support structure is rapidly cooled to about 100° C. by means of thermal conduction through contact with a refrigerated block within the deposition chamber, and a continuous layer of non-superconducting material 30 is then deposited on the superconducting layers 22 and 24. In depositing the non-superconducting material 30 the support structure is oriented with respect to the source of the non-superconducting material as indicated by the arrows 32 whereby the layer 30 covers the step 16. The material for layer 30 is preferably selected from the group consisting of copper, gold, semi-metals, and semiconductors.

Figure 2:
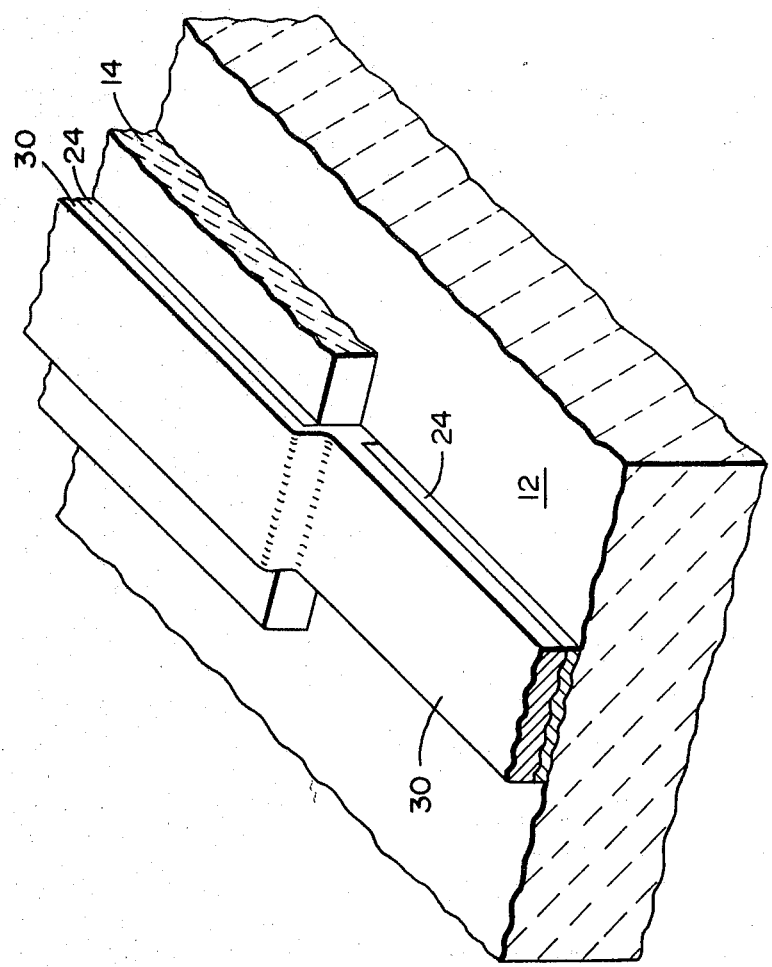
FIG. 2 is a perspective view of a microbridge superconducting device in accordance with the invention.

Thereafter, the layer 30 and the underlying superconductor material are selectively etched to define the width of the microbridge superconductive device as illustrated in the perspective view of FIG. 2. The material 30 is removed by conventional photoresist masking and chemical etching techniques with ferric chloride ($FeCl_3$) being used as an etchant for copper and a mixture of potassium iodide, iodine, and water being used as an etchant for gold. The underlying superconductor material is removed by plasma etch with $CF_4$ at 300 mtorr being used for niobium, $C_2ClF_5$ at 200 mtorr plus $ArO_2$ (20% $O_2$) at 50 mtorr being used for niobium tin, and $CF_4$ at 300 mtorr being used for niobium germanium.

The process utilizes known techniques of E beam vapor deposition, photoresist masking, and etching techniques and the process is readily controlled to maintain precise dimensions of the finished product. By performing the vapor deposition of the superconducting material and the non-superconducting material in the same deposition chamber, with rapid cooldown of the support following deposition of the superconducting layers, a very clean interface of the superconducting material and the normal material is provided. Further, by using a support having two parallel surfaces separated by a generally perpendicular step, the step provides a shadow mask during the evaporation of the superconducting layers thereby ensuring a discontinuity therebetween. Since the most important parameter of the device, the length of the junction, is determined by the height of the step, and since the step can be accurately measured and controlled in the vapor deposition of the silicon or other material, improved and uniform devices result from the reproducibility of the process. Moreover, the process allows the use of high temperature superconducting materials in fabricating the devices.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A microbridge superconductive device comprising an electrically insulating support having first and second generally parallel surfaces which are separated by a generally perpendicular step, a first layer of superconductive material on said first surface and a second layer of superconductive material on said second surface, said step defining a gap between said layers of superconductive material, and a layer of non-superconductive material over said first and second layers of superconductive material and in said gap, said non-superconductive material in said gap defining a junction between said layers of superconductive material.

2. The microbridge superconductive device as defined by claim 1 wherein said support comprises a substrate of first material having a planar surface and a layer of second material on said planar surface.

3. The microbridge superconductor device as defined by claim 2 wherein said substrate comprises sapphire.

4. The microbridge superconductor device as defined by claim 3 wherein said second material comprises silicon and a layer of barrier material which provides a diffusion barrier between said silicon and said superconductive material, said layer of barrier material extending to said planar surface of said first material and abutting said layer of superconductive material.

5. The microbridge superconductive device as defined by claim 4 wherein said layer of barrier material is selected from the group consisting of silicon oxide, silicon nitride, and aluminum oxide.

6. The microbridge superconductive device as defined by claim 3 wherein said second material is selected from the group consisting of silicon oxide, silicon nitride, and aluminum oxide.

7. The microbridge superconductive device as defined by claim 1 wherein said superconductive material is selected from the group consisting of niobium germanium, niobium tin, and niobium.

8. The microbridge superconducting device as defined by claim 7 wherein said normal material is selected from the group consisting of copper, gold, and semimetallic or semiconductive material.

* * * * *